(12) United States Patent
Cheng et al.

(10) Patent No.: US 12,170,302 B2
(45) Date of Patent: *Dec. 17, 2024

(54) INCREASED OPTICAL PATH FOR LONG WAVELENGTH LIGHT BY GRATING STRUCTURE

(71) Applicant: Taiwan Semiconductor Manufacturing Company, Ltd., Hsin-Chu (TW)

(72) Inventors: Yun-Wei Cheng, Taipei (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/166,560

(22) Filed: Feb. 9, 2023

(65) Prior Publication Data
US 2023/0197751 A1   Jun. 22, 2023

Related U.S. Application Data

(60) Continuation of application No. 17/156,851, filed on Jan. 25, 2021, now Pat. No. 11,581,352, which is a
(Continued)

(51) Int. Cl.
*H01L 27/146* (2006.01)

(52) U.S. Cl.
CPC .. *H01L 27/14629* (2013.01); *H01L 27/14621* (2013.01); *H01L 27/14627* (2013.01);
(Continued)

(58) Field of Classification Search
CPC ........ H01L 27/14629; H01L 27/14621; H01L 27/14627; H01L 27/1463; H01L 27/14645;
(Continued)

(56) References Cited

U.S. PATENT DOCUMENTS 8,964,081 B2   2/2015   Ohkubo
9,431,452 B1   8/2016   Liu
(Continued)

OTHER PUBLICATIONS

Non-Final Office Action dated Feb. 7, 2019 in connection with U.S. Appl. No. 15/938,066.
(Continued)

*Primary Examiner* — Dao H Nguyen
(74) *Attorney, Agent, or Firm* — Eschweiler & Potashnik, LLC

(57) ABSTRACT

Some aspects of the present disclosure relate to a method. In the method, a semiconductor substrate is received. A photodetector is formed in the semiconductor substrate. An interconnect structure is formed over the photodetector and over a frontside of the semiconductor substrate. A backside of the semiconductor substrate is thinned, the backside being furthest from the interconnect structure. A ring-shaped structure is formed so as to extend into the thinned backside of the semiconductor substrate to laterally surround the photodetector. A series of trench structures are formed to extend into the thinned backside of the semiconductor substrate. The series of trench structures are laterally surrounded by the ring-shaped structure and extend into the photodetector.

20 Claims, 14 Drawing Sheets

Related U.S. Application Data continuation of application No. 16/672,814, filed on Nov. 4, 2019, now Pat. No. 10,930,692, which is a continuation of application No. 16/578,296, filed on Sep. 21, 2019, now Pat. No. 10,804,307, which is a division of application No. 15/938,066, filed on Mar. 28, 2018, now Pat. No. 10,504,952.

(60) Provisional application No. 62/552,114, filed on Aug. 30, 2017.

(52) U.S. Cl.
CPC .... *H01L 27/1463* (2013.01); *H01L 27/14636* (2013.01); *H01L 27/14645* (2013.01); *H01L 27/14649* (2013.01); *H01L 27/14685* (2013.01); *H01L 27/14687* (2013.01)

(58) Field of Classification Search
CPC ......... H01L 27/14649; H01L 27/14685; H01L 27/14687; H01L 27/14643; H01L 27/146; H01L 27/14607; H01L 27/14612; H01L 27/1464; H01L 27/14689; H01L 27/14601
See application file for complete search history.

(56) References Cited

U.S. PATENT DOCUMENTS

| | | | |
|---|---|---|---|
| 9,754,984 B2 | 9/2017 | Hsu et al. | |
| 9,911,777 B2* | 3/2018 | Lee | H01L 27/1463 |
| 10,079,259 B2* | 9/2018 | Yu | H01L 27/14621 |
| 10,157,948 B2 | 12/2018 | Lee | |
| 10,504,952 B2 | 12/2019 | Cheng et al. | |
| 11,581,352 B2* | 2/2023 | Cheng | H01L 27/14645 |
| 2012/0009720 A1 | 1/2012 | Shim et al. | |
| 2014/0361355 A1* | 12/2014 | Shin | H01L 27/1464 |
| | | | 257/292 |
| 2014/0374868 A1 | 12/2014 | Lee | |
| 2015/0002713 A1* | 1/2015 | Nomura | H01L 27/14623 |
| | | | 348/302 |
| 2015/0061062 A1 | 3/2015 | Lin et al. | |
| 2017/0047367 A1* | 2/2017 | Lee | H01L 27/1463 |
| 2017/0104020 A1 | 4/2017 | Lee et al. | |
| 2017/0200760 A1 | 7/2017 | Zhang et al. | |
| 2018/0219040 A1 | 8/2018 | Choi et al. | |

OTHER PUBLICATIONS

Notice of Allowance dated Aug. 14, 2019 in connection with U.S. Appl. No. 15/938,066.

Non-Final Office Action dated May 29, 2020 for U.S. Appl. No. 16/672,814.

Notice of Allowance dated Oct. 21, 2020 for U.S. Appl. No. 16/672,814.

Non-Final Office Action dated Mar. 31, 2022 for U.S. Appl. No. 17/156,851.

Notice of Allowance dated Oct. 11, 2022 for U.S. Appl. No. 17/156,851.

* cited by examiner

INCREASED OPTICAL PATH FOR LONG WAVELENGTH LIGHT BY GRATING STRUCTURE

REFERENCE TO RELATED APPLICATIONS

This Application is a Continuation of U.S. application Ser. No. 17/156,851, filed on Jan. 25, 2021, which is a Continuation of U.S. application Ser. No. 16/672,814, filed on Nov. 4, 2019 (now U.S. Pat. No. 10,930,692, issued on Feb. 23, 2021), which is a Continuation of U.S. application Ser. No. 16/578,296, filed on Sep. 21, 2019 (now U.S. Pat. No. 10,804,307, issued on Oct. 13, 2020), which is a Divisional of U.S. application Ser. No. 15/938,066, filed on Mar. 28, 2018 (now U.S. Pat. No. 10,504,952, issued on Dec. 10, 2019), which claims the benefit of U.S. Provisional Application No. 62/552,114, filed on Aug. 30, 2017. The contents of the above-referenced Patent Applications are hereby incorporated by reference in their entirety.

BACKGROUND

Many modern day electronic devices comprise image sensors that convert optical images to digital data representing the optical images. One type of image sensor commonly used in electronic devices is a backside illumination (BSI) image sensor. A BSI image sensor comprises an array of photodetectors overlying an interconnect structure and configured to receive radiation on an opposite side as the interconnect structure. This arrangement allows radiation to impinge on the photodetectors unobstructed by conductive features in the interconnect structure, such that the BSI image sensor has high sensitivity to incident radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
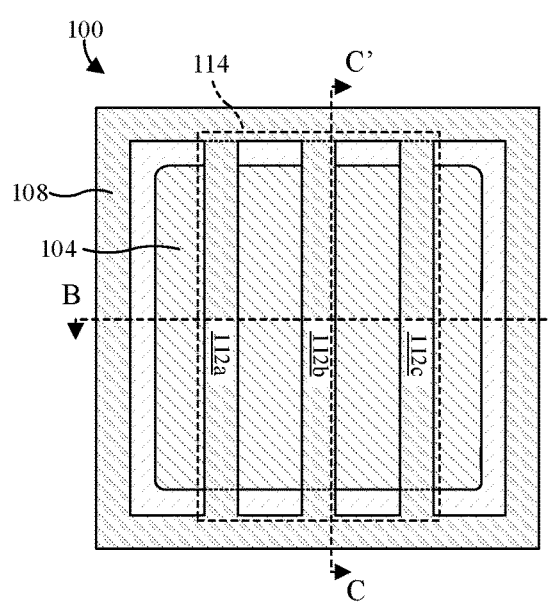
FIG. 1A illustrates a top view of some embodiments of a BSI image sensor with a grating structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 25:
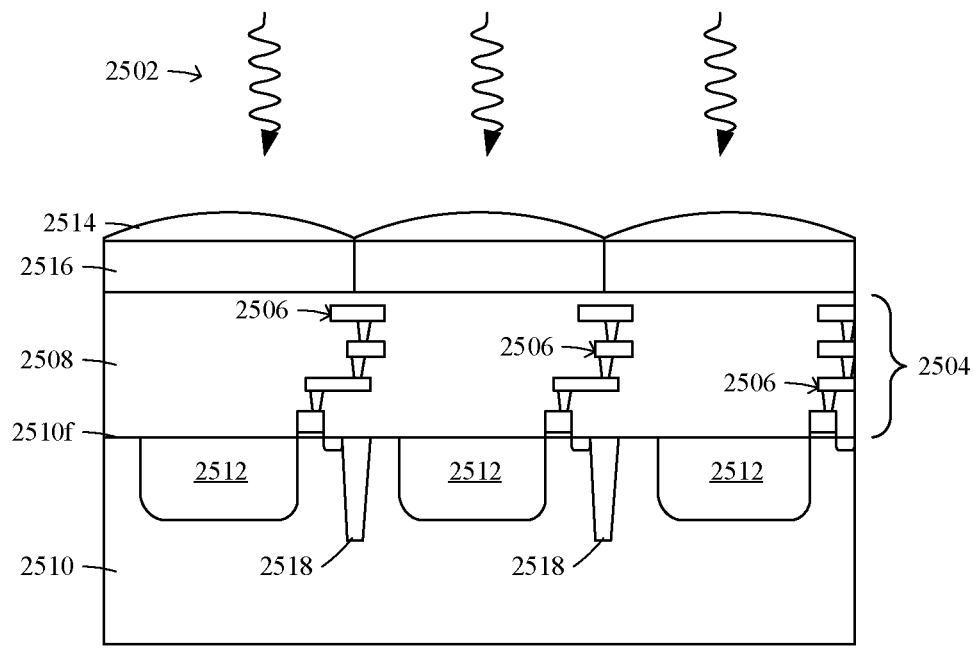
FIG. 25 illustrates a cross-sectional view of some embodiments of a front-side illumination (FSI) image sensor.

Standard IC manufacturing processes can produce image sensors that use frontside illumination (FSI) techniques or backside illumination (BSI) techniques. As shown in FIG. 25, with FSI, light 2502 falls on a frontside of the IC, and passes through an electrical interconnect structure 2504, such as a stack of back end of line (BEOL) metal layers 2506 disposed in a dielectric structure 2508, before passing into a frontside 2510f of a substrate 2510 and being collected at one or more photodetectors 2512 within the substrate. Often in FSI, the BEOL metal layers are structured to have openings (apertures) over the individual photodetectors, as the material of the BEOL metal layers can otherwise block light if arranged between the incident light and the photodetectors. To optimize the amount of light that reaches the photodetectors through these apertures; micro-lenses 2514, color filters 2516, trench isolation structures 2518, waveguides, and/or other optical features are often arranged over the BEOL metal layers 2506 to minimize reflections and help direct the 2502 light towards the respective photodetectors 2512.

Figure 26:
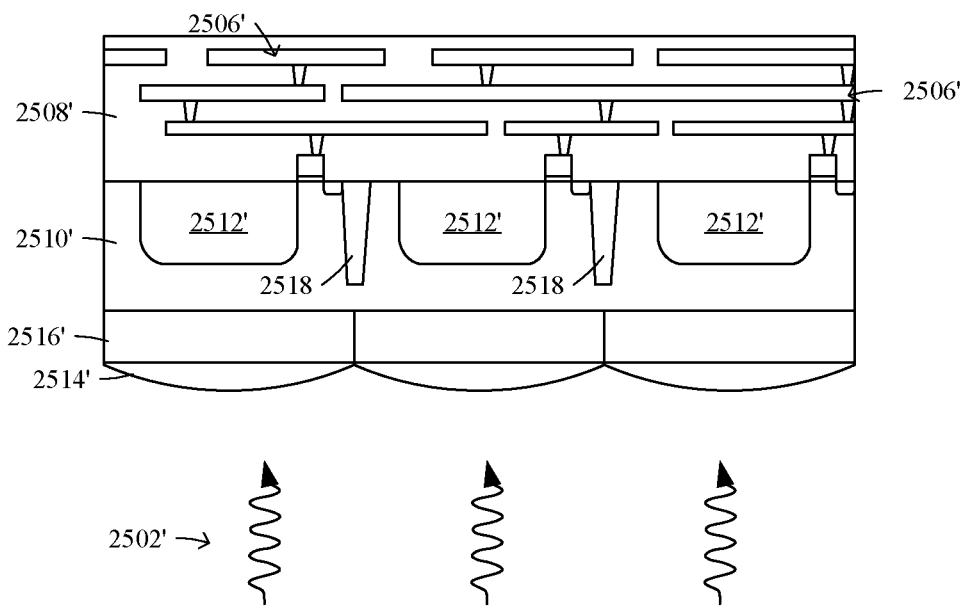
FIG. 26 illustrates a cross-sectional view of some embodiments of a back-side illumination (BSI) image sensor.

As shown in FIG. 26, in BSI, rather than having light pass through openings/apertures in the BEOL metal layers, the sensor is illuminated from the backside (i.e., the side 2510b of the substrate 2510' opposite the stack of BEOL metal layers 2508' and opposite the dielectric structure 2508). Compared to FSI, BSI allows a photodetector to have BEOL metal layers 2508' on one face of the substrate 2510' and its optical path (including color filters 2516' and micro-lenses 2514') on the other side of the substrate 2510', which allows better separation of optical elements from electrical elements. This means the optical path can be optimized independent of the electrical components and vice versa. The optical constraints for BSI are similar to FSI, except in BSI the photodetectors 2512' are often positioned closer to the micro-lenses 2514', which are now disposed on the backside of the thinned-down substrate surface. Also, because BSI removes the constraints associated with apertures in the BEOL metal layers 2508', BSI eliminates a loss mechanism for incident light 2502', potentially providing a higher quantum efficiency for the devices.

In the present disclosure, it has been appreciated that the thinned-down substrate utilized in BSI techniques may have challenges absorbing long wavelengths of incident light, such as infra-red light used in low-light conditions that are applicable to self-driving vehicles, security systems, and the like. For example, in some cases a thinned-down silicon substrate may have a total thickness of approximately 2-3 micrometers. This thickness is generally capable of achieving a sufficiently high quantum efficiency (QE) for photodetectors which receive visible light (e.g., wavelengths between 400 nm and 700 nm). However, for longer wavelengths of light, such as near infra-red light having a wavelength between 850 nm and 940 nm (and even visible red light to some extent), the QE for the photodetectors becomes very low, for example, less than 10% in some cases. One approach to allow better absorption of long wavelengths of light is to increase the thickness of the thinned-down substrate, for example to approximately 6 micrometers, thereby providing a longer light propagation path for the incident light to be absorbed. However, increasing the thickness of the substrate causes several manufacturing challenges. For example, etching through a 6 micrometer substrate is difficult during back end of line processing, and when a bond pad is ultimately formed on the top surface of the device, the increased thickness of the substrate can cause step height issues during processing. Thus, in many regards, it is desirable to continue to use a thinned-down Si substrate having a 2-3 micrometer thickness, but until now, it has been difficult to provide a BSI image sensor that can achieve a high QE for longer wavelengths of light in the process-friendly context of such a thinned-down Si substrate.

Accordingly, the present disclosure provides a BSI image sensor disposed on a thinned-down substrate, wherein the BSI image sensor includes a grating structure on a backside of the thinned-down substrate. The grating structure reflects incident light, often multiple times within the substrate, thereby lengthening the propagation path of the incident light compared to if the grating structure was not present (e.g., compared to if the incident light followed a single, purely linear path from the backside of the substrate to the photodetector). By increasing the propagation path for the light, the grating structure allows better detection of long wavelength light, such as near infra-red light or infra-red light for example, compared to other approaches. Thus, the grating structure facilitates the use of photodetectors on a thinned-down substrate in a BSI image sensor, while keeping sufficiently high QE for longer wavelengths of light.

Figure 1C:
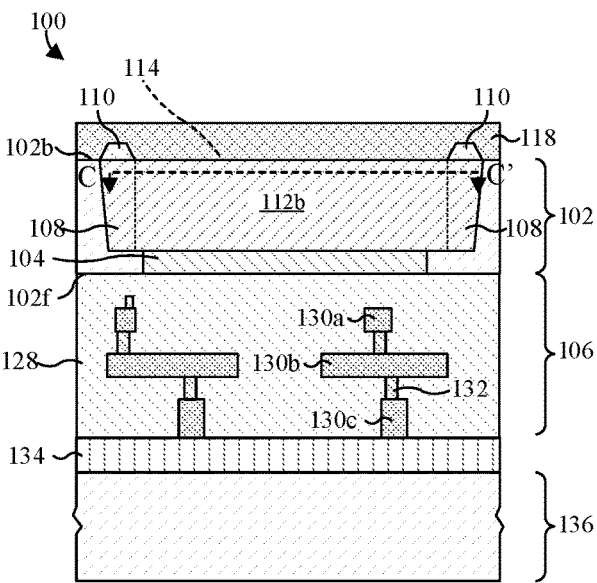
FIGS. 1B-1C illustrate cross-sectional views of some embodiments of consistent with FIG. 1A's BSI image sensor.
Figure 1B:
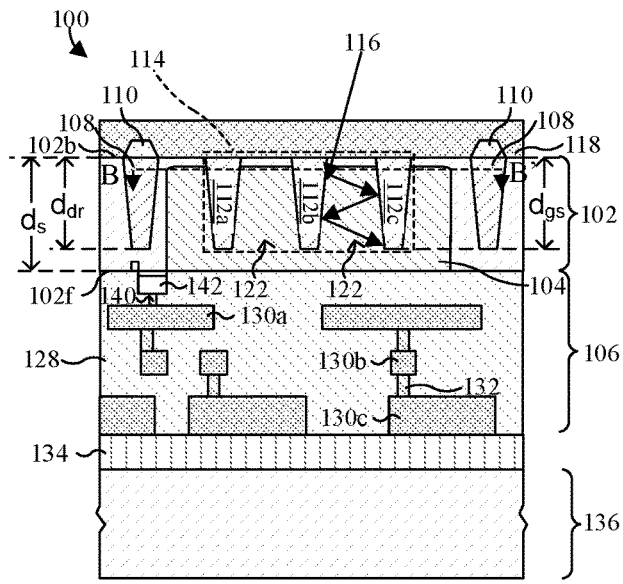

With reference to FIGS. 1A-1C, a top view (FIG. 1A) and cross-sectional views (FIG. 1B—taken along line B-B' in FIG. 1A; and FIG. 1C—taken along line C-C' in FIG. 1A) of some embodiments of a BSI image sensor 100 is provided.

As illustrated in FIGS. 1A-1C, the BSI image sensor 100 includes a semiconductor substrate 102 having a frontside 102$f$ and a backside 102$b$, wherein a photodetector 104 is arranged in the semiconductor substrate 102 between the frontside 102$f$ and the backside 102$b$. The photodetector 104 is configured to absorb incident light 116 impinging thereon. Further, the photodetector 104 is or otherwise includes a doped semiconductor region of opposite doping type as a surrounding region of the semiconductor substrate 102. For example, in some embodiments, the photodetector 104 is a photodiode that includes a p-type region (anode) and an n-type region (cathode), which meet one another at a pn junction. In other embodiments, the photodetector 104 includes a p-type region (anode), an n-type region (cathode), and an insulating region separating the p-type region from the n-type region, such that the photodiode includes a pin junction. When a photon of sufficient energy strikes the photodiode, an electron-hole pair is created. If the absorption occurs in the junction's depletion region or one diffusion length away from it, these carriers are swept from the junction by the built-in electric field of the depletion region. Thus holes move toward the anode and electrons toward the cathode, such that a photocurrent is produced.

An interconnect structure 106 is arranged beneath the frontside 102$f$ of the semiconductor substrate such that the frontside 102$f$ is arranged between the interconnect structure 106 and the backside 102$b$. The interconnect structure 106 underlies the photodetector 104, the semiconductor substrate 102, and the frontside 102$f$ of the semiconductor substrate 102. The interconnect structure 106 comprises an interlayer dielectric (ILD) structure 128, and a plurality of metal lines (e.g., 130$a$, 130$b$, 130$c$) stacked over one another and passing through the ILD structure 128. Contacts (e.g., 140) electrically connect a first metal line (e.g., 130$a$) to a gate electrode 142 on the substrate 102 or to an active region in the substrate 102, while vias 132 electrically connect metal lines of different metal layers to one another. In some embodiments, the metal lines and vias comprise a metal, such as copper, titanium, chromium, niobium, lead, palladium, gold, silver, aluminum, tungsten, and/or alloys thereof, or some other conductive material. In some embodiments, the ILD structure 128 may be, for example, silicon dioxide, a low κ dielectric (i.e., a dielectric with a dielectric constant κ less than about 3.9), phosphosilicate glass (PSG), some other dielectric, or a combination of the foregoing. For example, the ILD structure 128 may comprise a silicon dioxide or PSG layer and a plurality of low κ dielectric layers stacked below the silicon dioxide or PSG layer.

A passivation layer 134, such as a silicon nitride layer or silicon oxynitride layer, is disposed on a bottom surface of the interconnect structure 106. A carrier substrate 136 is disposed under the passivation layer 134. The carrier substrate 136 has a thickness greater than that of the substrate 102 to provide additional structural rigidity for the BSI image sensor 100. In some embodiments, for example, the substrate 102 is a thinned-down monocrystalline silicon substrate having a thickness, $d_s$, of approximately 2-6 micrometers, or even 2-3 micrometers, while the carrier substrate 136 is a semiconductor or glass substrate having a thickness that is at least an order of magnitude, and often several orders of magnitude, greater than that of the thinned-down monocrystalline silicon substrate.

A lower ring structure 108, which is typically made of dielectric material, extends into the backside 102$b$ of the semiconductor substrate 102 and laterally surrounds the photodetector 104. In some embodiments, the lower ring structure 108 is made of silicon dioxide. In some embodiments, the lower ring structure 108 extends to a depth, $d_{dr}$, which is 30% to 100% of the total thickness, $d_s$, of the semiconductor substrate 102.

An upper ring structure 110 extends over the backside 102b of the semiconductor substrate and is aligned over the lower ring structure 108. The upper ring structure 110 can be made entirely of metal or can be made of metal and dielectric materials. The lower ring structure 108 and upper ring structure 110 help to guide incident light 116 towards the photodetector 104, and a passivation layer 118, such as a silicon nitride or silicon oxynitride layer, covers the backside 102b and the upper ring structure 110. In some embodiments, the lower ring structure 108 and/or the metallic ring structure 110 is in a shape of a square, a rectangle, or a polygon, and may have rounded corners, as viewed from above. In some embodiments, the metallic ring structure 110 has inner and outer sidewalls aligned with inner and outer sidewalls of the lower ring structure 108, such that the metallic ring structure 110 and lower ring structure 108 share a common central axis and have equal radial wall thicknesses. In other embodiments, the metallic ring structure 110 may have a radial wall thickness that is greater than or less than that of the lower ring structure 108, and/or may have a central axis that is offset from a central axis of the lower ring structure 108.

A grating structure 114, which is surrounded by the lower ring structure 108, extends from the backside 102b of the substrate to a position within the photodetector 104. As shown in the top view of FIG. 1A, in some embodiments the grating structure 114 includes a plurality of linear trenches. The plurality of trenches can be filled with dielectric material or metal to form pillars or walls (e.g., 112a, 112b, 112c) that are spaced apart from one another so centerlines of the plurality of trenches are spaced at equal intervals from one another. In FIG. 1A, the centerlines of the plurality of trenches are arranged in parallel with outer edges of the lower ring structure 108. In FIG. 1C, the top and bottom edges of the trenches are in direct contact with inner sidewalls of lower ring structure 108. Light guide openings 122 pass between adjacent pillars or walls, are bound by the one or more pillars or walls. The one or more pillars or walls are configured to reflect incident light 116 multiple times in the semiconductor substrate 102 through the light guide openings 122 as the incident light 116 travels from the backside 102b to the photodetector 104, thereby inducing a first piecewise linear light propagation path through the light guide openings 122 in the semiconductor substrate 102. In some embodiments, the depth of the grating structure 114, $d_{gs}$, can be shallower or deeper than the depth, $d_{dr}$, of the lower ring structure 108. For example $d_{gs}$ can range from 30%-150% of the depth $d_{dr}$. In some embodiments, the lower ring structure 108 and the upper ring structure 110 are fabricated using the same photolithography mask and same etch, so the depths $d_{gs}$ and $d_{dr}$ are equal or near equal, which is advantageous in that it simplifies the fabrication process.

In some embodiments, the depth of the grating structure 114 is equal to a depth of the lower ring structure 108. In other embodiments, the depth of the grating structure 114 is greater than or less than a depth of the lower ring structure 108. The pillars or walls 112 of the grating structure can be made of metal (e.g., Cu, W, Ni, Al) or dielectric materials (e.g., $SiO_2$, $Si_3N_4$, high-k dielectric, or low-k dielectric) or air (partially or fully), or a combination of metal, dielectric, and/or air.

The grating structure 114 is structured to change the direction of incident light 116 from vertically incident (or near vertically incident) to near lateral propagation. For example, in some embodiments when the incident angle of impingent light 116 is 23-degrees, which is the critical angle of total internal reflection between Si and $SiO_2$), the optical path is increased from 2.5 microns to 6.4 microns, and the QE may be significantly improved, for example by perhaps more than 100% for near-infra-red wavelength of 850-940 nm. In some cases, the reflected light may be incident at vertical, and may be redirected to have an angle of within 10-40 degrees of horizontal, thereby realizing a significant increase in optical path length.

Figure 2:
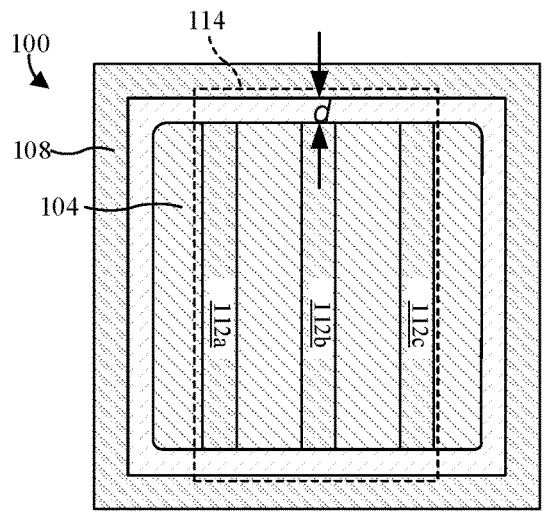
FIGS. 2-10 illustrate additional top views of a BSI image sensor with a grating structure.

FIG. 2 shows another example where the top and bottom edges of the trenches are spaced apart from the inner sidewalls of lower ring structure 108 by distance d. The distance d can be less than what is illustrated, in which case the top and/or bottom edges of the trenches reside beyond an outermost edge of the photodetector 104; or can be greater than what is illustrated, in which case the top and/or bottom edges of the trenches are recessed within the outermost edge of the photodetector 104.

Figure 3:
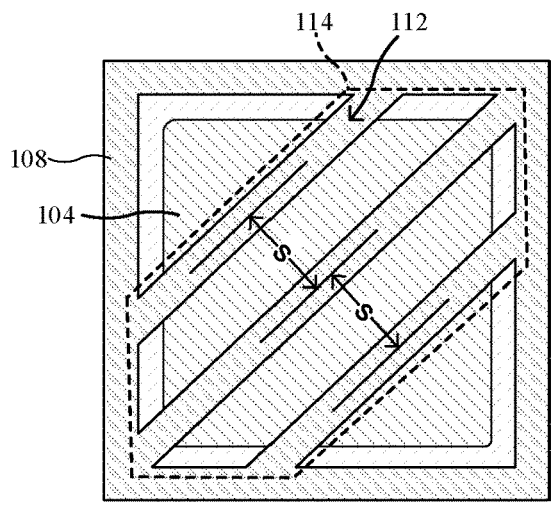

FIG. 3 shows a top view of another embodiment, wherein the grating structure 114 comprises a plurality of trenches filled with dielectric or metal material. In FIG. 3, the plurality of trenches of the grating structure 114 extend in parallel with one another and meet outer edges of the lower ring structure 108 at an angle of approximately forty-five degrees. Again, in the illustrated embodiment of FIG. 3, the plurality of trenches are spaced apart from one another so centerlines of the plurality of trenches are spaced at equal intervals, s, from one another. However, in other embodiments the spacing between centerlines of the trenches can be different from one another.

Figure 4:
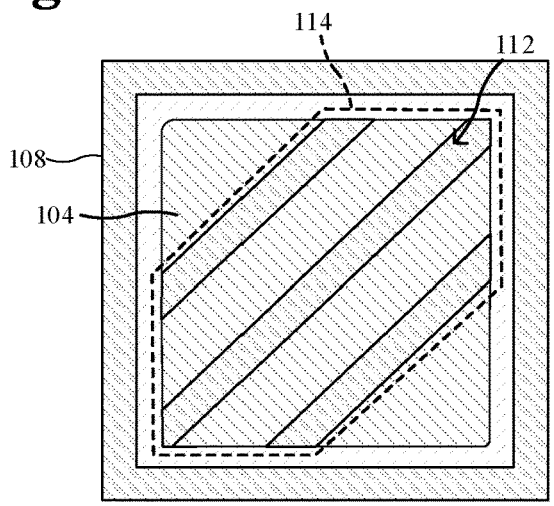

FIG. 4 shows a top view of another embodiment, where the pillars or walls 112 meet the lower ring structure 108 at an angle ranging from 30° to 60°. In some embodiments, the angle at which the pillars or walls 112 meet the lower ring structure 108 is 45°.

Figure 5:
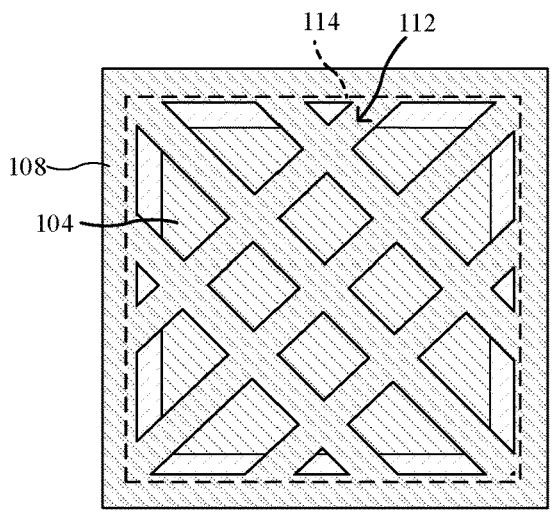
Figure 6:
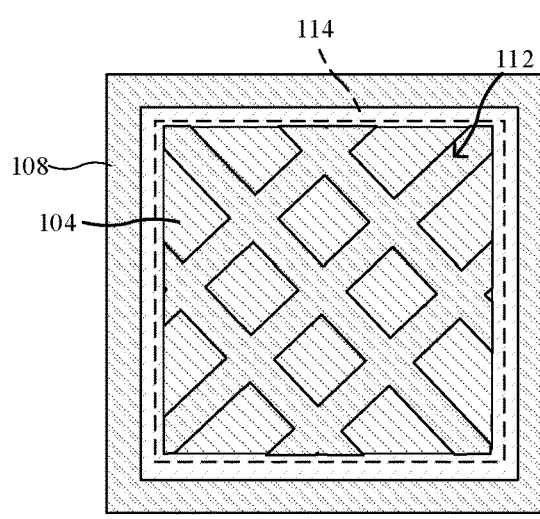

FIGS. 5-6 provide top views of additional embodiments with pillars or walls 112 arranged in rows in columns. Thus, a first set of trenches extend in parallel in a first direction, and a second set of trenches extend in parallel in a second direction that intersects the first direction. In some embodiments, the first set of trenches intersects the second set of trenches at an angle ranging from 30° to 60°. In some embodiments, the angle at which the first and second sets of trenches intersect is 45°.

Figure 7:
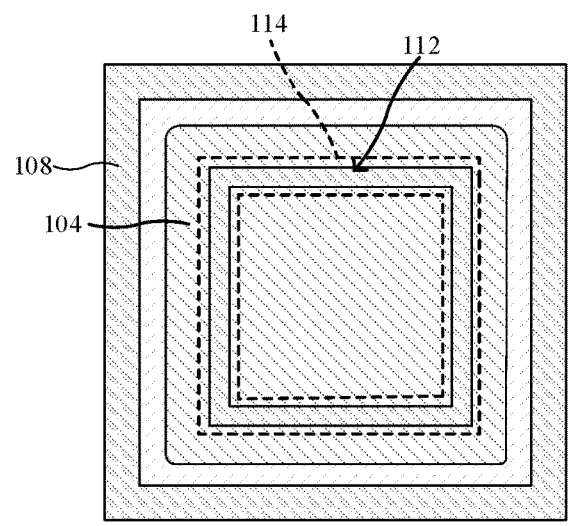

FIG. 7 shows a top view of another embodiment, wherein the grating structure 114 is a single ring-shaped structure and has edges that are congruous to outer edges of the lower ring structure 108. The ring-shaped grating structure 114 can be filled with dielectric or metal material. The ring-shaped grating structure 114 can have a diameter that ranges from approximately 25% to approximately 80% of the radius of the lower ring structure 108, in some embodiments.

Figure 8:
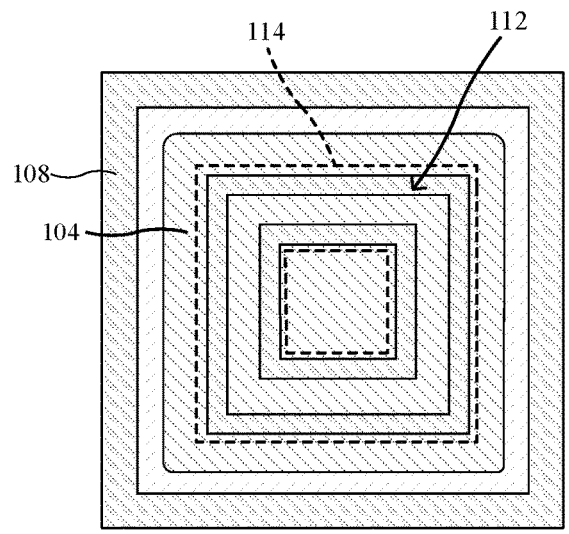

FIG. 8 shows a top view of another embodiment, wherein the grating structure 114 includes multiple ring-shaped structures which are concentric. Although two concentric rings are shown, any number of concentric rings may be included for a pixel. The concentric rings may have the same annular widths as one another in some embodiments, and may have equal spacings between nearest edges of nearest rings; but in other embodiments the concentric rings may have different annular widths from one another; and may have different spacings between nearest edges of nearest rings.

Figure 9:
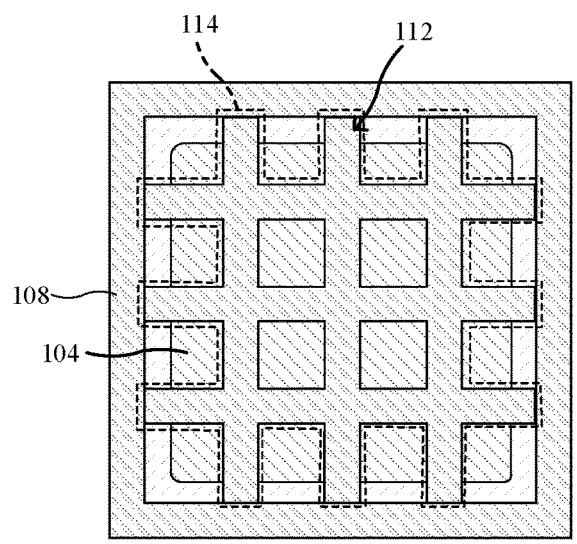
Figure 10:
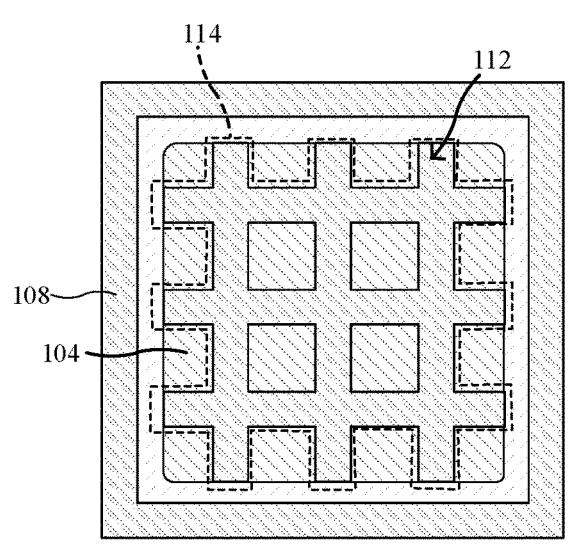

FIGS. 9-10 provide top views of additional embodiments with trenches arranged in rows in columns. Thus, a first set of trenches extend in parallel in a first direction, and a second set of trenches extend in parallel in a second direction perpendicular to the first direction. In some cases, the first and second sets of trenches each perpendicularly intersect the lower ring structure 108.

Thus, it will be appreciated that many structural embodiments are possible for the grating structure 114. In some embodiments, the grating structure 114 occupies between ten percent and sixty percent of a total area bounded by the lower ring structure 108. In some embodiments, the lower ring structure 108 is square or rectangular (as illustrated in the top view of FIG. 1A), however, in other embodiments, the lower ring structure 108 can be triangular, hexagonal, octagonal, etc. Further, in some embodiments, the maximum width of the grating structure 114 between its outermost edges is between 5% and 30% of the maximum width of the lower ring structure 108 for a single pixel.

Figure 11A:
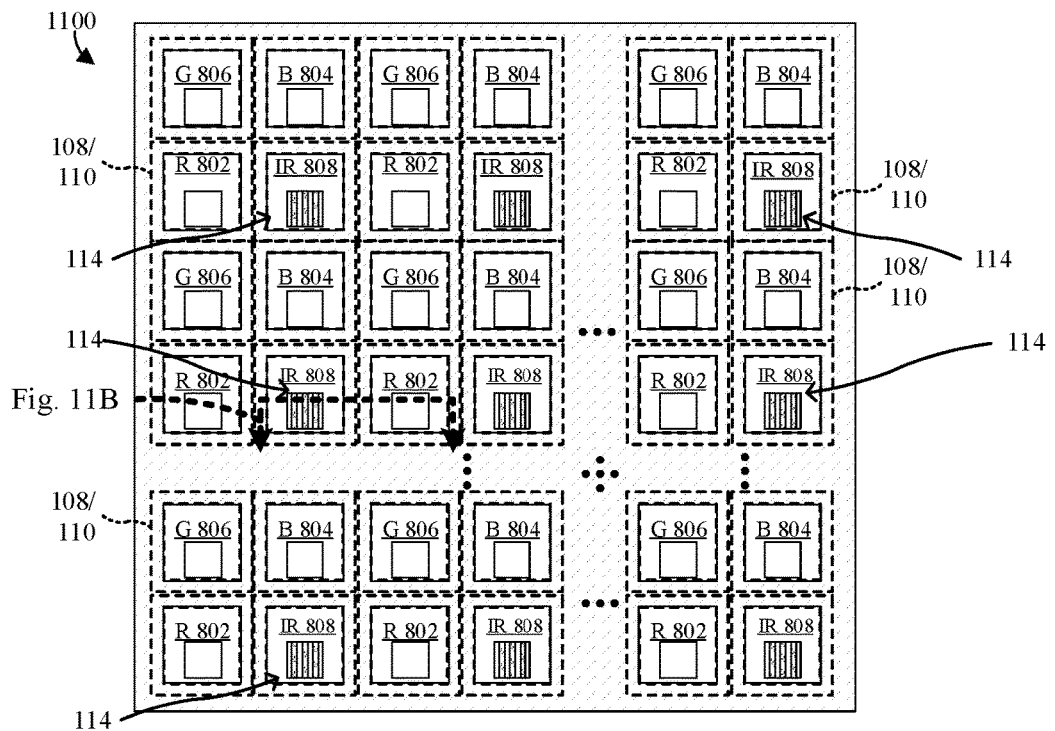
FIG. 11A illustrates a top view of some embodiments of a BSI image sensor which includes an array of pixels, wherein at least some of the pixels include a grating structure.
Figure 11B:
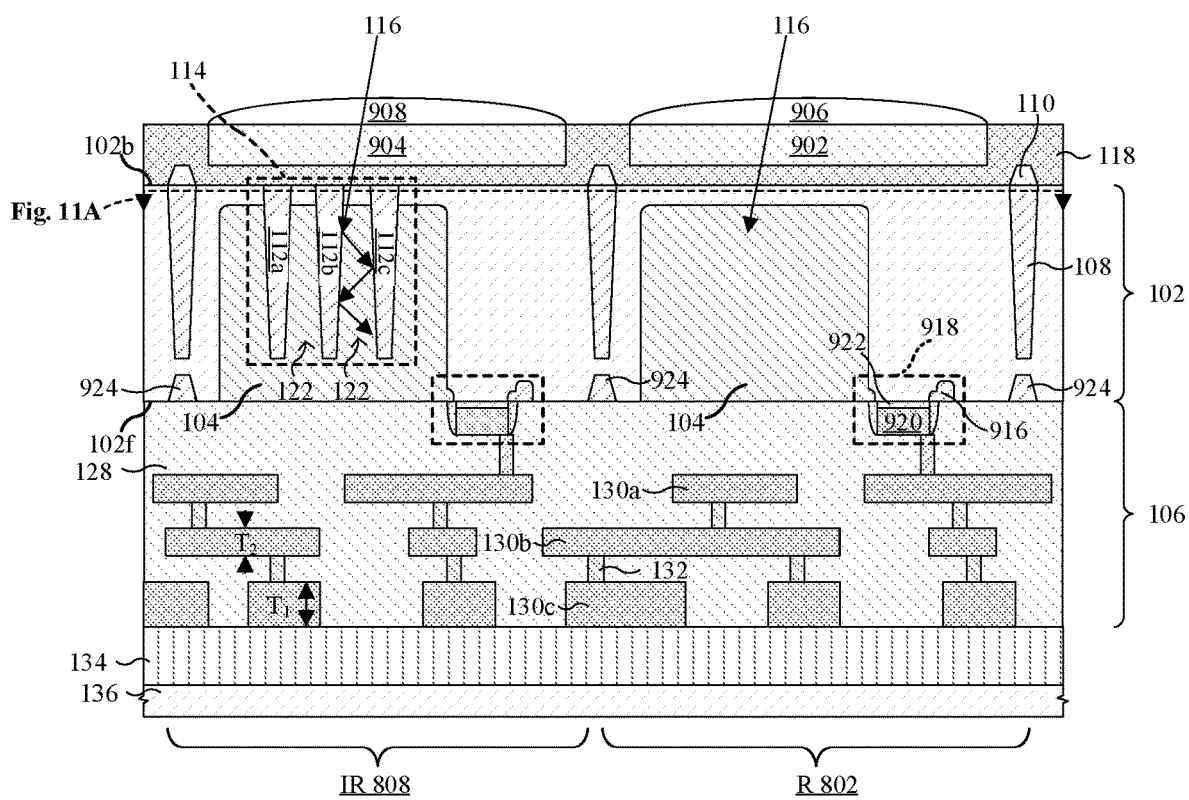
FIG. 11B illustrates a cross-sectional view of some embodiments of a BSI image sensor consistent with FIG. 11A.

FIGS. 11A-11B illustrate an image sensor in accordance with some other embodiments. FIG. 11A illustrates a top view of the image sensor, which includes a plurality of pixels arranged in rows and columns; while FIG. 11B provides a corresponding cross-sectional view of two neighboring pixels.

With reference to FIG. 11A, a top view 1100 of some embodiments of the image sensor, which includes an array of pixel sensors, is provided. The pixel sensors 802, 804, 806, 808 are assigned respective wavelengths of radiation. In some embodiments, the pixel sensors 802, 804, 806, 808 are alternatingly assigned red wavelengths of radiation (e.g., about 620 to about 750 nanometers), green wavelengths of radiation (e.g., about 495 to about 570 nanometers), blue wavelengths of radiation (e.g., about 450 to about 495 nanometers), and infrared wavelengths of radiation (e.g., about 850 nm to about 940 nm). For example, pixel sensors 802 labeled "R" are assigned red wavelengths of radiation, pixel sensors 804 labeled "B" are assigned blue wavelengths of radiation, pixel sensors 806 labeled "G" are assigned green wavelengths of radiation, and pixel sensors 808 labeled "IR" are assigned infrared wavelengths of radiation. Further, in some embodiments, the pixel sensors 802, 804, 806 alternate between red, green, and blue wavelength assignments generally according to a Bayer filter mosaic, but with IR pixel sensors 808 interspersed therein to detect infrared wavelengths.

A grating structure 114 is selectively positioned within at least some of the pixel sensors. For example, a grating structure 114 is positioned within pixel sensors which are configured to receive light at longer wavelengths, such as infrared pixel sensors 808, while pixel sensors which are to receive shorter wavelengths do not have a grating structure in place. Thus, red, blue, and green pixel sensors 802, 804, 806 have a shorter light propagation path in the substrate (e.g., due to fewer reflections within the substrate stemming from a lack of a grating structure 114 for these pixel sensors), while the infrared pixel sensors 808 have a longer light propagation path (e.g., piecewise linear light propagation path due to multiple reflections stemming from the presence of a grating structure 114).

To assign wavelengths to the various pixels, the pixel sensors may comprise individual color filters configured to filter incident radiation according to the assigned wavelengths of radiation, as shown in FIG. 11B for example. For example, as seen in FIG. 11B, a red pixel sensor 802 comprises a red color filter 902 arranged thereover, which allows red light to pass through while attenuating or blocking other wavelengths of light; while an infrared pixel sensor 808 comprises an infrared color filter 904 (or lack of a color filter) as well as a grating structure 114, which increases the light propagation path of incident infrared light through the substrate to allow better absorption of the infrared light, which has a long wavelength. Micro-lenses 906, 908 on the upper surface of passivation layer 118 can also help to direct the incident light towards the respective photodetectors of the pixels (802, 808, respectively).

Still referring to FIGS. 11A-11B, a plurality of metallic ring structures 110 is arranged over the backside of the semiconductor substrate. Outer edges of the plurality of metallic ring structures 110 adjoin one another to establish a metallic mesh structure lying in a plane parallel to the backside of the semiconductor substrate 102. Each metallic ring structure 110 of the metallic mesh structure surrounds a projection of a photodetector 104 as projected in the plane. A grating structure 114, which is surrounded by a first upper ring structure 110*a* of the upper mesh structure, extends from the backside of the substrate to a depth corresponding to a photodetector 104 within the semiconductor substrate. Similarly, outer edges of the lower ring structures 108 adjoin one another to establish a lower mesh structure embedded within the backside 102*b* of the substrate 102.

In some embodiments, each pixel sensor further comprises a transfer transistor 918, which is configured to selectively transfer pent up charge to a floating diffusion node (FDN) 916. The FDN 916 is configured to store charge transferred thereto from the photodetector 104, and the transfer transistor 918 is configured to selectively transfer the charge to the FDN 916. The FDN 916 is arranged in the semiconductor substrate 102, and is or otherwise includes a doped semiconductor region of opposite doping type as a surrounding region of the semiconductor substrate. The transfer transistor 918 comprises a gate 920 arranged on the semiconductor substrate 102, laterally adjacent to the photodetector 104, and spaced from the semiconductor substrate 102 by a gate dielectric layer 922. Further, the transfer transistor 918 comprises source/drain regions arranged in the semiconductor substrate, respectively on opposing sides of the gate 920, to define a channel region over the gate 920. In some embodiments, one of the source/drain regions corresponds to the photodetector 104, and/or one of the source/drain regions corresponds to the FDN 916. Shallow trench isolation (STI) regions 924, which are often made of dielectric material such as silicon dioxide for example, may also be present in some embodiments, and be aligned with lower ring structure 108 and/or metallic ring structure 110. A height of the STI regions 924 may be less than a height of the lower ring structure 108 and/or metallic ring structure 110 in some embodiments, but may be greater than a height of the lower ring structure 108 and/or metallic ring structure 110 in other embodiments.

Figure 11C:
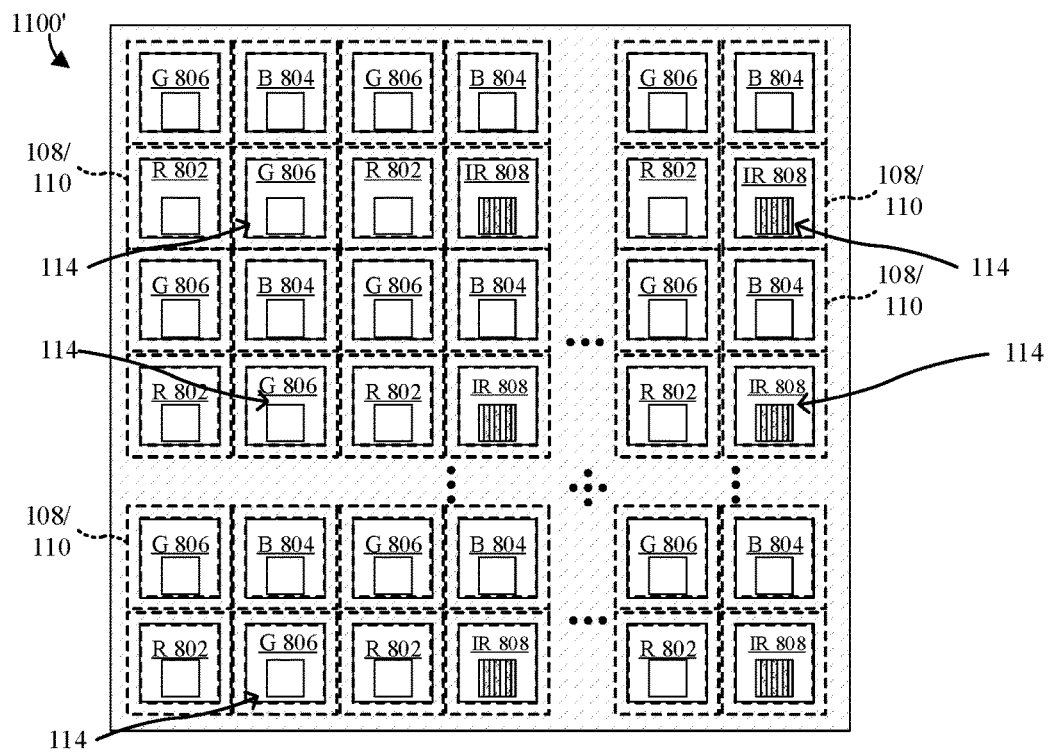
FIGS. 11C-11D illustrate additional top views of some embodiments of a BSI image sensor which includes an array of pixels, wherein at least some of the pixels include a grating structure.
Figure 11D:
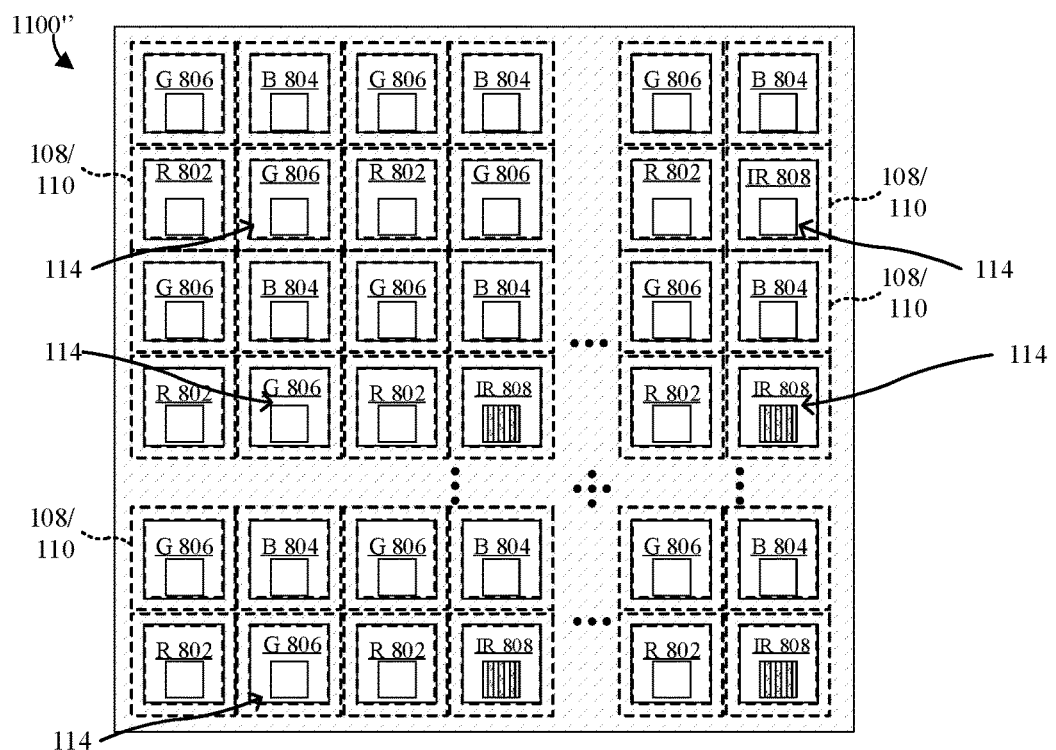

Although FIGS. 11A-11B show an example where only some of the sensor pixels have a grating structure, in other embodiments all sensor pixels of the array can have a grating structure or fewer sensor pixels of the array can have a grating structure. For example, FIG. 11C shows an embodiment of an image sensor where one out of eight pixels has a grating structure corresponding to an infrared pixel, and FIG. 11D shows an embodiment of an image sensor where one out of sixteen pixels has a grating structure corresponding to an infrared pixel. Other variations are also possible, and the illustrate cases are merely examples. Moreover, in some embodiments, different pixels can have grating structures with different geometries and/or spacings between centerlines of nearest neighboring walls, pillars, or trench structures of the grating structure, to "tune" the length of the light propagation path for that pixel.

In some embodiments, a difference in length between a first piecewise linear light propagation path (e.g., piecewise linear light propagation path for infrared light through IR pixel 808) and a second light propagation path (e.g., linear propagation path for red light through red pixel 802) is proportional to a difference between the first wavelength and the second wavelength.

A passivation layer 118 is arranged over the semiconductor substrate 102 on an opposite side of the semiconductor substrate 102 as the interconnect structure 106. The passivation layer 118 comprises a recess filled with a color filter (e.g., 902, 904) and covered by a micro-lens (e.g., 906, 908). The passivation layer 118 may be, for example, a multilayer stack of dielectric layers, such as, for example, a nitride layer stacked between a pair of oxide layers.

Figure 12A:
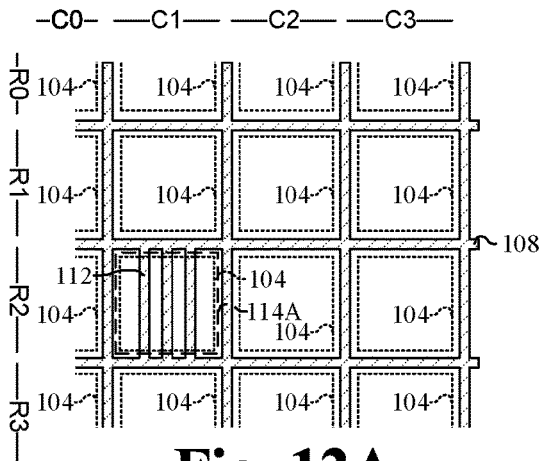
FIGS. 12A-12F illustrate a series of top views of some embodiments of a BSI image sensor which includes an array of pixels, wherein at least some of the pixels include a grating structure.
Figure 12B:
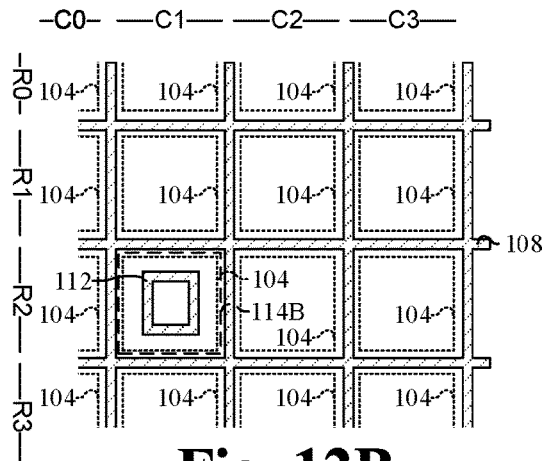
Figure 12C:
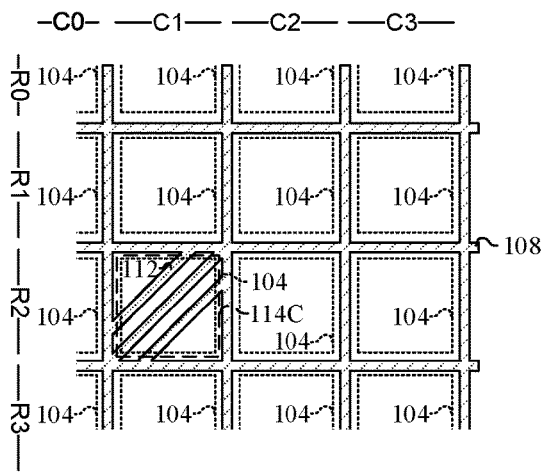
Figure 12D:
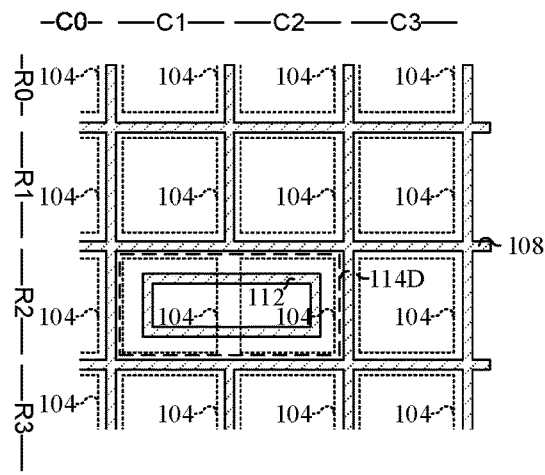

With reference to FIG. 12A-12F a series of top views of some embodiments of a pixel array is provided. Each top view depicts a portion of a pixel array, and for purposes of clarity is illustrated as including pixels arranged in four columns (C0-C3) and four rows (R0-R3). At the intersection of each row and column is a photodetector 104, which is disposed within a semiconductor substrate. In FIGS. 12A-12C, each photodetector is individually laterally surrounded by a corresponding lower ring structure 108, such that the dielectric ring structures 108 merge with one another to form a dielectric mesh over the pixel array. Some pixels include a grating structure 114 (e.g., 114A-114F) made up of pillars or walls 112 that are configured to reflect light multiple times in the substrate to induce a piecewise linear light propagation path to improve absorption of longer wavelength light. Other pixels, which receive shorter wavelengths of light, lack a grating structure over their photodetector.

Figure 12E:
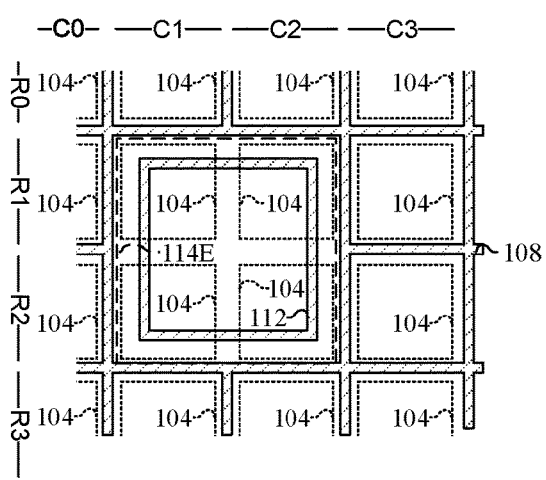
Figure 12F:
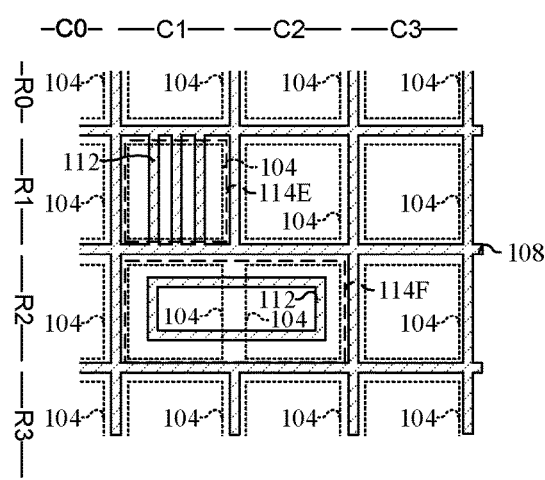

In some embodiments, a grating structure can span multiple columns and rows of the array, and thus, a single grating structure can overlie multiple photodetectors. For example, in FIG. 12D, grating structure 114D overlies the photodetectors of columns C1-C2 along row R3, and there is a "break" in the lower ring structure 108 between columns C1-C2 to accommodate this grating structure 114D. In FIG. 12E, grating structure 114E overlies the photodetectors of columns C1-C2 along rows R1-R2, and there is a "break" in the lower ring structure 108 between columns C1-C2 and rows R1-R2 to accommodate this grating structure 114E. FIG. 13F shows still another embodiment where different sizes of grating structures (114F, 114G) are included in a pixel array. Thus, the first grating structure 114F in FIG. 13F is confined over a single pixel; while a second grating structure 114G in FIG. 13F spans multiple pixels. The first and second grating structures 114F-114G can be used to detect different wavelengths of light. FIGS. 12A-12F illustrate merely a few examples, and other grating structures are also contemplated as falling within the scope of the present disclosure.

Figure 13:
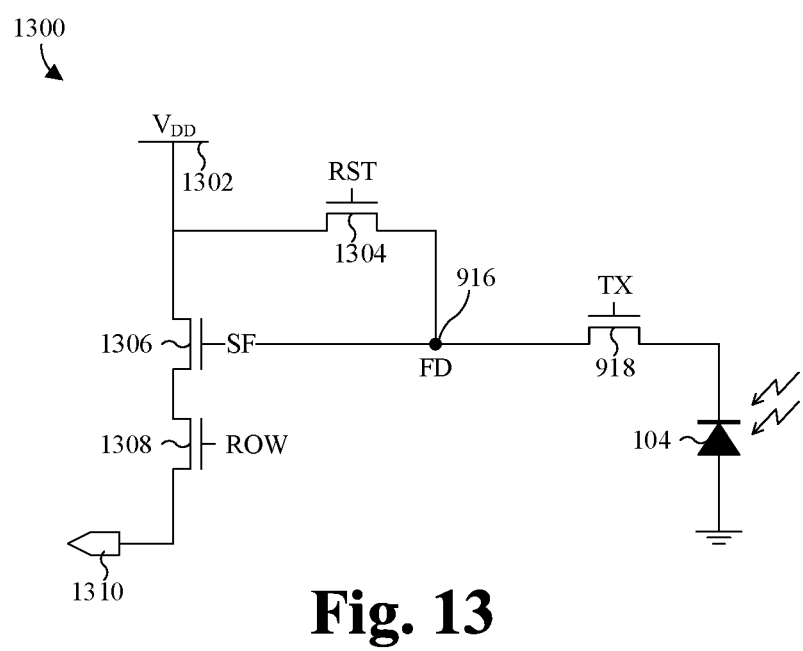
FIG. 13 illustrates a circuit diagram of some embodiments of a pixel sensor.

With reference to FIG. 13, a circuit diagram 1300 of some embodiments of a pixel sensor in the image sensor of FIGS. 11A-11B is provided. As illustrated, a FDN 916 is selectively coupled to a photodetector 104 by a transfer transistor 918, and is selectively coupled to a power source 1302 by a reset transistor 1304. The photodetector 104 may be, for example, a photodiode, and/or the power source 1302 may be, for example, a direct current (DC) power source. The transfer transistor 918 is configured to transfer charge accumulated in the photodetector 104 to the FDN 916, and the reset transistor 1304 is configured to clear charge stored at the FDN 916. The FDN 916 gates a source follower transistor 1306 that selectively couples the power source 1302 to a row select transistor 1408, and the row select transistor 1308 selectively couples the source follower transistor 1306 to an output 1310. The source follower transistor 1306 is configured to non-destructively read and amplify charge stored in the FDN 916, and the row select transistor 1308 is configured to select the pixel sensor for readout.

While the image sensor is described as having five transistors within FIG. 13, it is to be appreciated that other embodiments of the pixel sensor may include more or less transistors. For example, other embodiments of the image sensor may include two, three, or six transistors.

FIGS. 14-23 depict a series of cross-sectional views that collectively illustrate a method of manufacturing an image sensor device in accordance with some embodiments. The method may be employed to form the image sensor of FIGS. 1A-1C. It is to be understood that the method may also be employed with the embodiments of any one of FIGS. 2-13.

Figure 14:
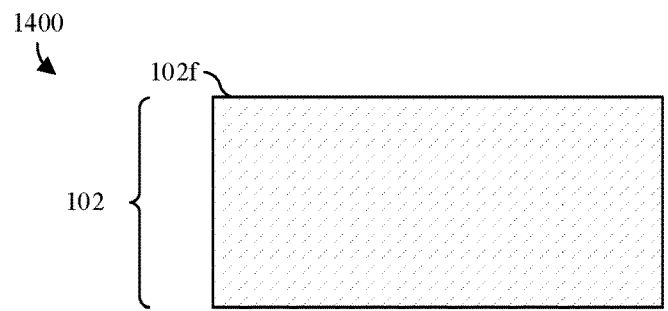
FIGS. 14-23 illustrate a series of cross-sectional views that collectively illustrate some embodiments of a method of manufacturing a BSI image sensor with a grating structure.

As illustrated by the cross-sectional view 1400 of FIG. 14, a semiconductor substrate 102 is provided or formed. In some embodiments, the semiconductor substrate 102 is or comprises a bulk silicon substrate, some other bulk semiconductor substrate, or some other semiconductor substrate. The semiconductor substrate 102 may be or comprise, for example, monocrystalline silicon, nanoporous silicon, some other silicon, some other semiconductor material, or any combination of the foregoing. Further, the semiconductor substrate 102 may, for example, have an n-type or p-type doping.

Figure 15:
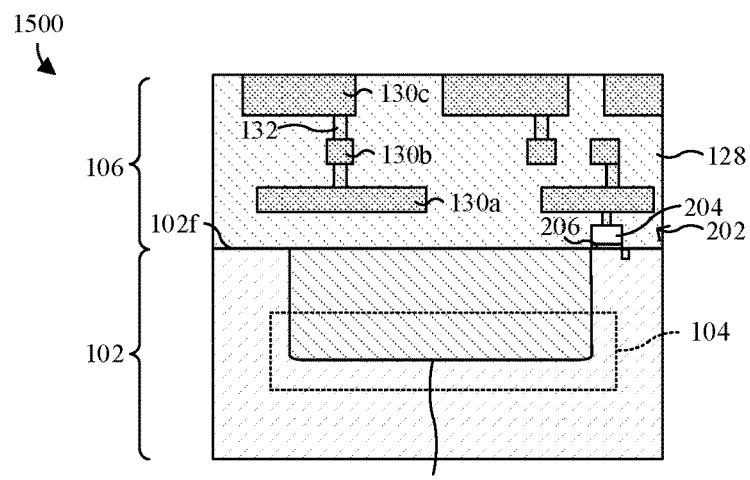

As illustrated by the cross-sectional view 1500 of FIG. 15, a photodetector 104 is formed proximate to the semiconductor substrate 102. In some embodiments, a process for forming the photodetector 104 comprises implanting dopants into the substrate 102 to form a doped semiconductor region 1502. In some of such embodiments, the substrate 102 initially has a single doping type, such that the doping of the doped semiconductor region 1502 is performed using dopants of an opposite doping type. The doping may, for example, be performed using ion implantation or some other doping process, and/or may, for example, use a photoresist mask to selectively implant the dopants. Thus, the doped semiconductor region 1502 meets the substrate 102 at a photo junction 1504. In other embodiments, first and second wells, which have opposite conductivity and are implanted one over the other to meet at a photo junction, can be separately implanted to for the photodetector 104.

A transfer transistor 202 is formed for each pixel. Each transfer transistor 202 comprises a gate electrode 204, a gate dielectric layer 206, a first source/drain region (not labeled), and a second source/drain region (not labeled). The first source/drain region may be defined by, for example, the doped semiconductor region. The second source/drain region may be defined by, for example, a FDR in the semiconductor substrate 102.

As illustrated by the cross-sectional view 1500 of FIG. 15, an interconnect structure 106 is formed covering the the each pixel and the substrate 102. The interconnect structure 106 comprises an ILD structure 128, a plurality of wires 130, and a plurality of vias 132. For ease of illustration, only some of the wires are labeled, and only some of the vias are labeled.

In some embodiments, a process for forming the interconnect structure 106 comprises repeatedly forming an ILD sublayer (i.e., a sublayer of the ILD structure 128) over the substrate 102, performing a planarization into a top surface of the ILD structure 128, selectively etching the ILD structure to form a via opening and/or a wire opening, and filling the via opening and/or the wire opening with a conductive material. The ILD sublayer may, for example, be formed by thermal oxidation, CVD, PVD, sputtering, some other deposition process, or any combination of the foregoing. The planarization may, for example, be performed by a chemical mechanical polish (CMP) or some other planarization process. The selective etching may, for example, be performed "selectively" using photolithography. The filling may, for example, be performed by CVD, PVD, electroplating, electro-less plating, some other deposition or plating process, or any combination of the foregoing. In some embodiments, the process for forming the interconnect structure 106 comprises repeatedly performing a dual-damascene process or a single-damascene process to form the wires 130 and the vias 132. The dual-damascene process forms two conductive features (e.g., a wire and a via) at the same time, whereas the single-damascene process forms a single conductive feature (e.g., a wire or a via) at a time.

Figure 16:
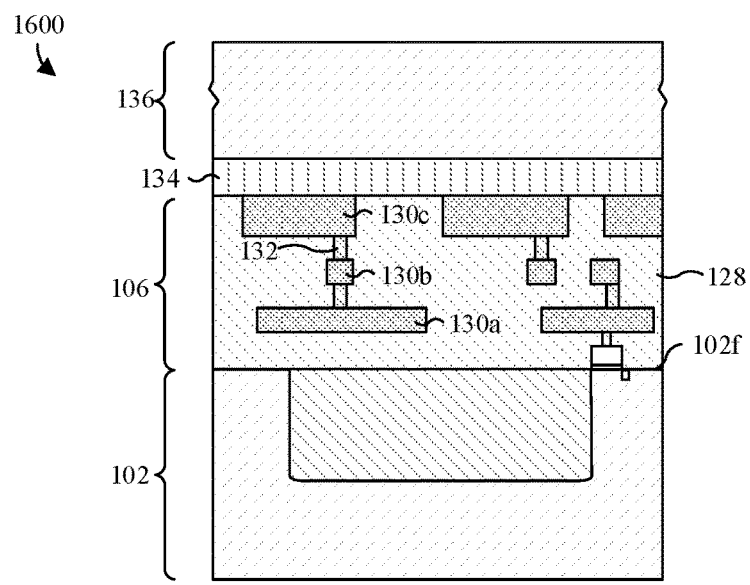

As illustrated by the cross-sectional view 1600 of FIG. 16, in some embodiments, a front-side surface of the substrate 102 is bonded to a carrier substrate 136 through a passivation layer 134 and the ILD structure 128. The carrier substrate 136 may be, for example, a bulk monocrystalline silicon substrate, some other silicon substrate, a SOI substrate, a semiconductor substrate, or some other substrate. In some embodiments, the bonding process is performed by a fusion bonding process or some other bonding process.

Figure 17:
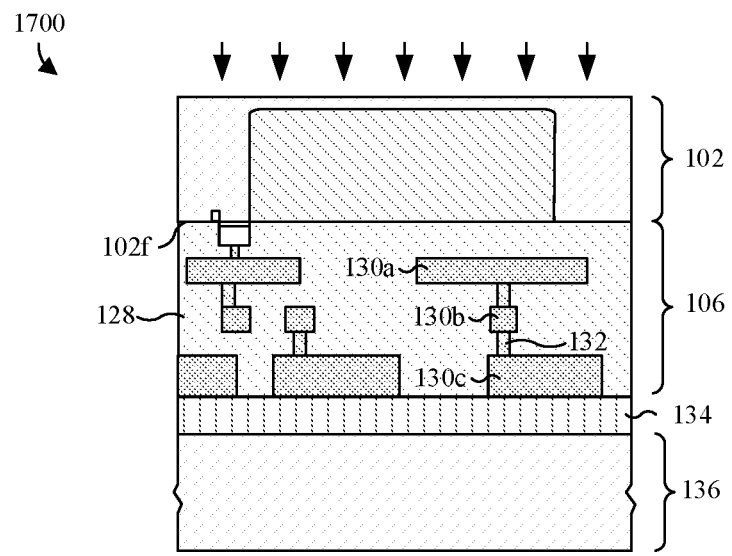

As illustrated by the cross-sectional view 1700 of FIG. 17, the structure of FIG. 16 is flipped vertically. Further, the substrate 102 is thinned at the back-side surface, thereby reducing a thickness of the substrate 102. In some embodiments, the substrate 102 is thinned by performing an etch and/or a planarization, such as a CMP or some other planarization process.

Figure 18:
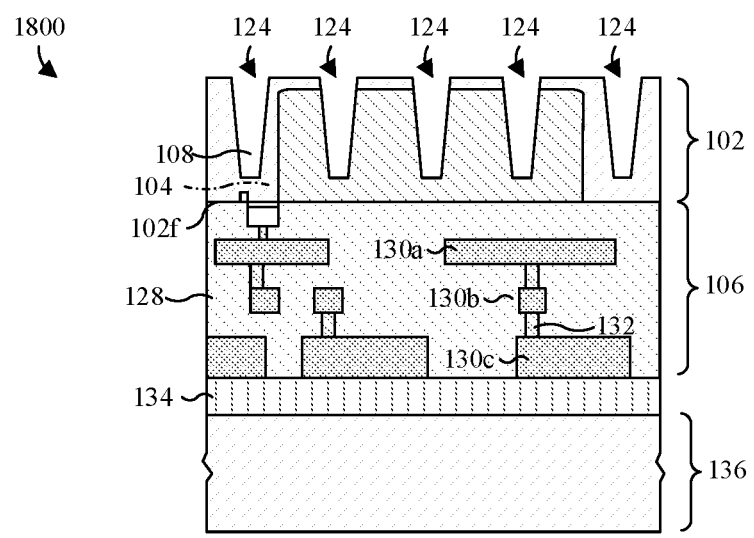

As illustrated by the cross-sectional view 1800 of FIG. 18, a plurality of trenches 124 is formed in the back-side of the semiconductor substrate 102. In some embodiments, the process for forming the trenches 124 comprises performing an etch into the back-side surface of the substrate 102 with a photoresist layer in place, and subsequently removing the photoresist layer. In some cases, an outermost ring-shaped trench which corresponds to an outer perimeter of the pixel is etched in one etch, and a series of inner trenches which are surrounded by the outermost ring-shaped trench are etched separately using a different etch. Thus, the outermost ring-shaped trench can have a first depth and the series of inner trenches can have a second depth that is different from the first depth. In other embodiments, the outermost ring-shaped trench and the series of inner trenches are all formed concurrently using a single etch process, and share a single depth.

Figure 19:
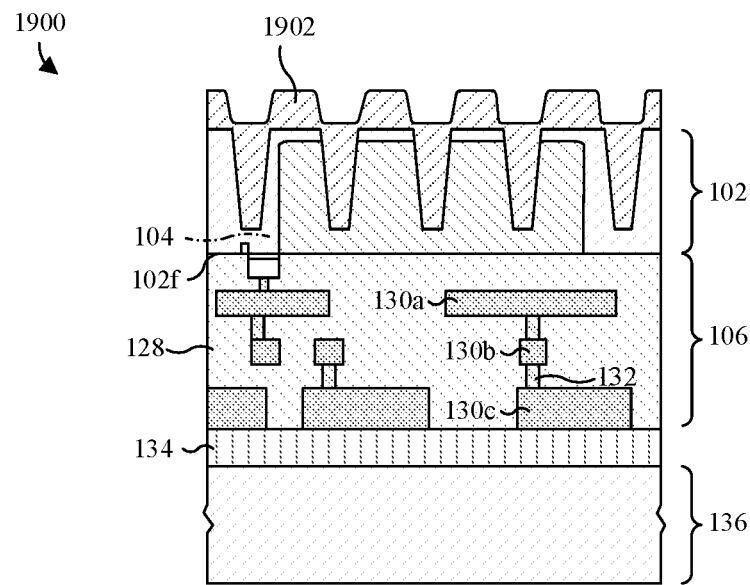

As illustrated by the cross-sectional view 1900 of FIG. 19, a dielectric material 1902 is deposited in the series of trenches. In some embodiments, an inner surface of the dielectric material 1902 conforms and/or directly contacts the back-side surface of the substrate 102. The dielectric material 1902 may be or comprise, for example, silicon dioxide, silicon nitride, a high κ dielectric, some other dielectric, or any combination of the foregoing.

In some embodiments, a process for forming the dielectric material 1902 comprises depositing the dielectric material 1902 in the trenches. The depositing may, for example, be performed by thermal oxidation, CVD, PVD, sputtering, or some other deposition process.

Figure 20:
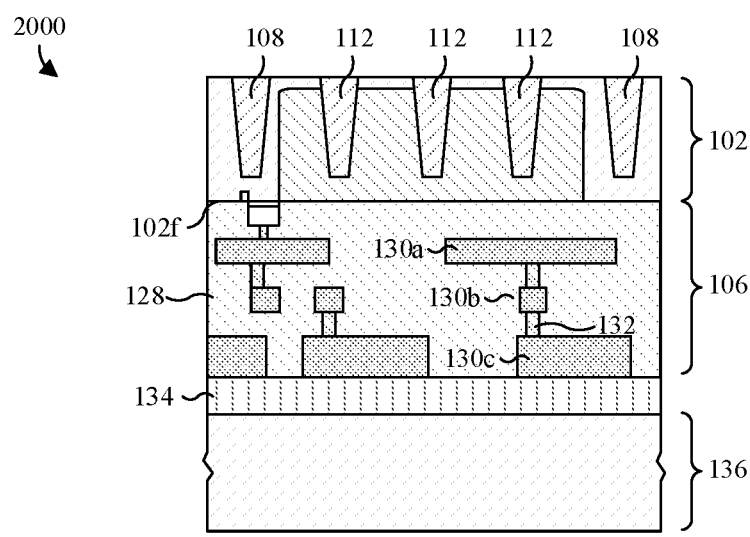

As illustrated by the cross-sectional view 2000 of FIG. 20, a planarization into the outer surface of the dielectric material 1902 is performed, thereby forming dielectric pillars or walls 112 which are surrounded by a lower ring structure 108. The planarization may, for example, be performed by a CHIP or some other planarization process.

Figure 21:
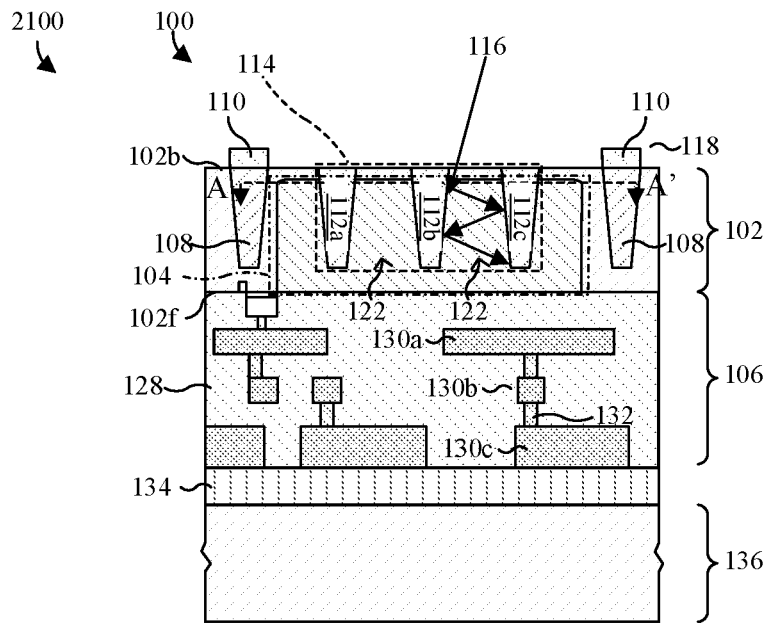

As illustrated by the cross-sectional view 2100 of FIG. 21, a metallic ring structure 110 is formed over the lower ring structure 108. The metallic ring structure 110 can be formed, for example, by forming a patterning layer, such as a silicon nitride layer for example, over the substrate 102; and then patterning the patterning layer to form openings whose locations correspond to locations of the metallic ring structure 110. Then, with the patterning layer in place, metal can be formed, for example by sputtering, electroplating, or CVD for example, in the openings and over the patterning layer. CMP can then be performed to remove the metal from over the patterning layer and expose an upper surface of the patterning layer, while leaving the metal in the openings. Then, the patterning layer can be removed, leaving the structure illustrated in FIG. 21.

Figure 22:
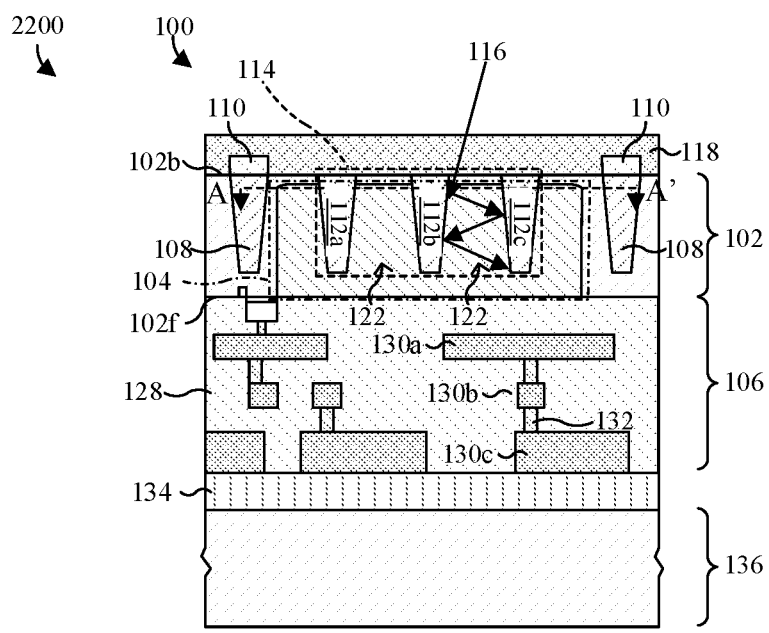

As illustrated by cross-sectional view 2200 of FIG. 22, a passivation layer 118 is formed covering the back-side surface of the substrate 102 and covering the metallic ring structure 110. The passivation layer 118 may be or comprise, for example, silicon dioxide, silicon nitride, a high κ dielectric, some other dielectric, or any combination of the foregoing. In some embodiments, a process for forming the passivation layer 118 comprises depositing the passivation layer 118 on the back-side surface of the substrate 102, and subsequently performing a planarization into the outer surface of the passivation layer 118. The depositing may, for example, be performed by thermal oxidation, CVD, PVD, sputtering, or some other deposition process. The planarization may, for example, be performed by a chemical mechanical polish (CMP) or some other planarization process.

Figure 23:
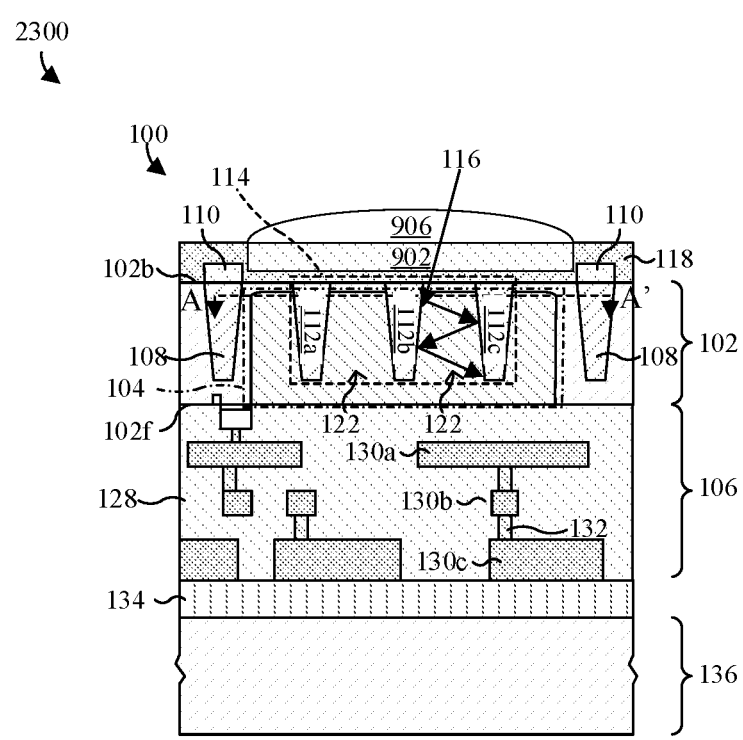

As illustrated by the cross-sectional view 2300 of FIG. 23, a plurality of color filters (e.g., 902) and a plurality of micro-lenses (e.g., 906) are formed on the passivation layer 118. The color filters 902 respectively overlie the photodetectors 104, and the micro-lenses 906 respectively overlie the color filters 404. The color filter 902 passes assigned wavelengths of radiation while blocking unassigned wavelengths of radiation. In some embodiments, the color filters 904 are formed by forming a color filter layer for first wavelengths of radiation, patterning the color filter layer, and then repeating the foregoing for different wavelengths of radiation.

Also illustrated by the cross-sectional view 2300 of FIG. 23, a plurality of micro-lenses 906 is formed on the color filters 904. The micro-lens 906 overlies the color filter 904, and focus incident radiation respectively on the photodetector of the pixel. In some embodiments, a process for forming the micro-lenses 906 comprises forming a micro-lens layer over the color filters 904, and subsequently patterning the micro-lens layer into micro-lens templates individual to the micro-lens 906.

Figure 24:
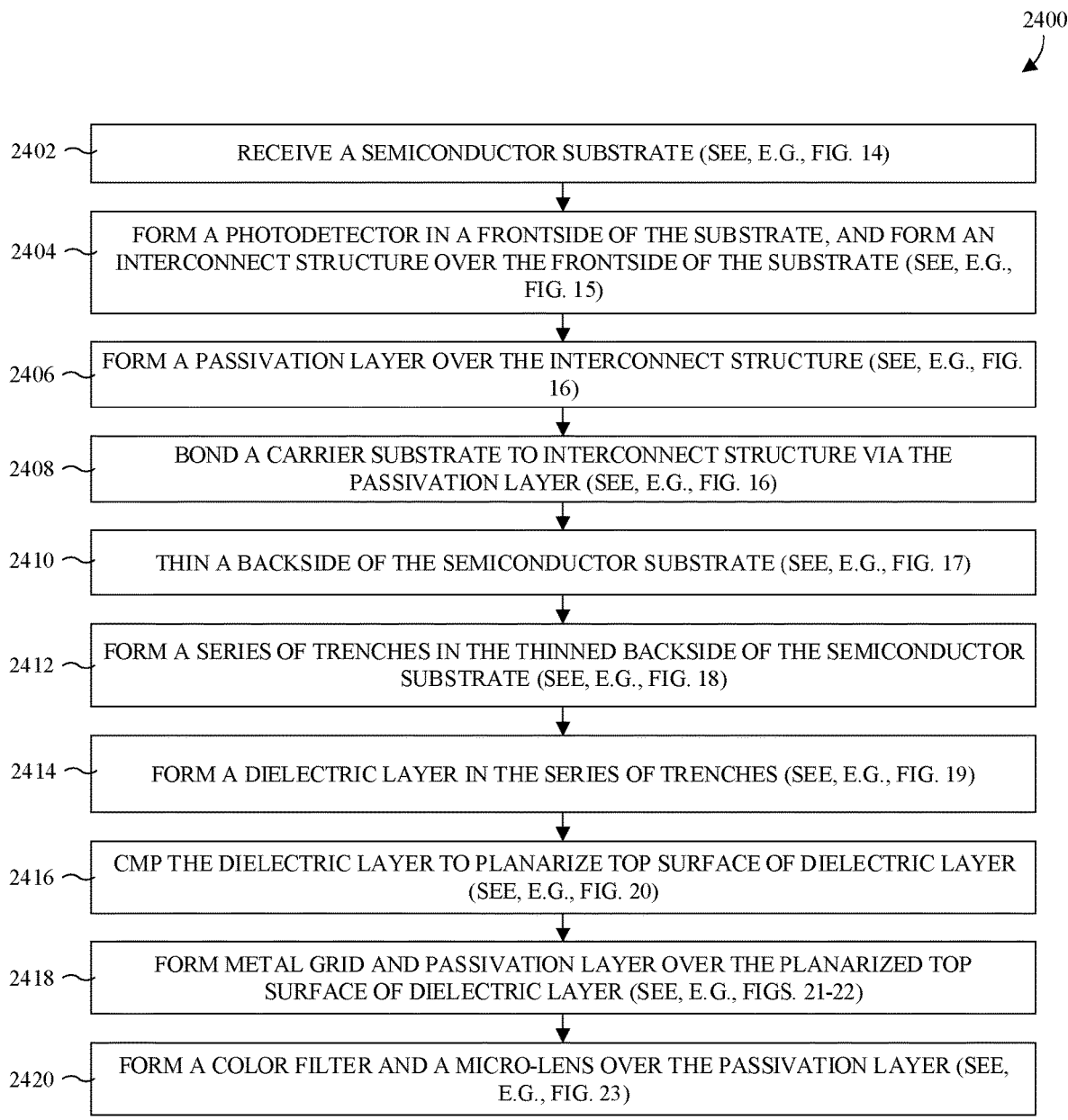
FIG. 24 illustrates a flow chart consistent with some embodiments of a method of forming a BSI image sensor with a grating structure.

FIG. 24 illustrates a flowchart consistent with some embodiments of a method of forming a BSI image sensor.

At 2402, a semiconductor substrate is received. Some embodiments of this act can correspond to FIG. 14, for example.

At 2404, a photodetector is formed in a frontside of the substrate, and an interconnect structure is formed over the frontside of the substrate. Some embodiments of this act can correspond to FIG. 15, for example.

At 2406, a passivation layer is formed over the interconnect structure. Some embodiments of this act can correspond to FIG. 16, for example.

At 2408, a carrier substrate is bonded to the interconnect structure via the passivation layer. Some embodiments of this act can correspond to FIG. 16, for example.

At 2410, a backside of the semiconductor substrate is thinned, for example by CMP. Some embodiments of this act can correspond to FIG. 17, for example.

At 2412, a series of trenches is formed in the thinned backside of the semiconductor substrate. Some embodiments of this act can correspond to FIG. 18, for example.

At 2414, a dielectric layer is formed in the series of trenches. Some embodiments of this act can correspond to FIG. 19, for example.

At 2416, the dielectric layer is planarized (e.g., using CMP) to planarize a top surface of dielectric layer. Some embodiments of this act can correspond to FIG. 20, for example.

At 2418, a metal grid and passivation layer are formed over the planarized top surface of dielectric layer. Some embodiments of this act can correspond to FIGS. 21-22, for example.

At 2420, a color filter and a micro-lens are formed over the passivation layer. Some embodiments of this act can correspond to FIG. 23, for example.

Thus, as can be appreciated from above, some aspects of the present disclosure relate to an image sensor that includes a semiconductor substrate having a frontside and a backside. A photodetector is arranged in the semiconductor substrate between the frontside and the backside. An interconnect structure is arranged beneath the frontside of the semiconductor substrate such that the frontside of the semiconductor substrate is arranged between the interconnect structure and the backside of the semiconductor substrate. A lower ring structure extends into the backside of the semiconductor substrate and laterally surrounds the photodetector. A grating structure, which is surrounded by the lower ring structure, extends from the backside of the substrate to a position within the photodetector.

Other embodiments relate to an image sensor disposed in or on a semiconductor substrate having a frontside and a backside. The image sensor includes a plurality of photodetectors arranged in the semiconductor substrate between the frontside and the backside. A plurality of metallic ring structures is arranged over the backside of the semiconductor substrate. Outer edges of the plurality of metallic ring structures adjoin one another to establish a metallic mesh structure lying in a plane parallel to the backside of the semiconductor substrate. Each metallic ring structure of the metallic mesh structure surrounds a projection of a photodetector as projected in the plane. A grating structure, which is surrounded by a first metallic ring structure of the metallic mesh structure, extends from the backside of the substrate to a depth corresponding to a first photodetector within the semiconductor substrate.

Still other embodiments relate to a method. In this method, a semiconductor substrate is received. A photodetector is formed in a frontside of the substrate, and an interconnect structure is formed over the photodetector and over the frontside of the substrate. A carrier substrate is formed over to the interconnect structure. A backside of the semiconductor substrate is thinned, the backside being furthest from the interconnect structure. A series of trenches is formed in the thinned backside of the semiconductor substrate. A dielectric layer is formed in the series of trenches, and the dielectric layer is planarized to leave the dielectric layer with a planarized top surface. Planarizing the dielectric layer separates the dielectric layer to leave a ring-shaped dielectric layer in the substrate and to leave wall or pillar dielectric structures which are laterally surrounded by the ring-shaped dielectric layer. The wall or pillar dielectric structures are disposed over the photodetector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a semiconductor substrate having a first side and a second side, wherein a plurality of photodetectors is arranged in the semiconductor substrate between the first side and the second side; and
   a grating structure extending from the second side of the semiconductor substrate into a photodetector of the plurality of photodetectors, wherein the grating structure includes one or more first wall features extending along a first direction with respect to a top view and one or more second wall features extending along a second direction perpendicular to the first direction with respect to the top view; and
   wherein the one or more first wall features directly contact a doped region of the photodetector.

2. The image sensor of claim 1, further comprising:
   an interconnect structure arranged beneath the first side of the semiconductor substrate such that the first side of the semiconductor substrate is arranged between the interconnect structure and the second side of the semiconductor substrate.

3. The image sensor of claim 1, wherein the one or more first wall features are arranged to form an N×N grid with respect to the top view, with N being an integer.

4. The image sensor of claim 1, further comprising
   a first ring structure extending into the second side of the semiconductor substrate and laterally surrounding the photodetector.

5. The image sensor of claim 4, wherein the first ring structure includes a first pair of parallel edges extending along the first direction with respect to the top view and a second pair of parallel edges extending along the second direction.

6. The image sensor of claim 4, wherein the one or more first wall features intersect the first ring structure.

7. The image sensor of claim 4, wherein the one or more first wall features are spaced apart from the first ring structure.

8. The image sensor of claim 4, further comprising a second ring structure extending over the second side of the semiconductor substrate and substantially aligned over the first ring structure.

9. The image sensor of claim 4, wherein the one or more first wall features have a first depth into the second side and the first ring structure has a second depth into the second side, wherein the first depth ranges between 30% and 150% of the second depth.

10. The image sensor of claim 4, wherein the one or more first wall features have a first depth into the second side and the first ring structure has a second depth into the second side, wherein the first depth is less than 50% of the second depth.

11. The image sensor of claim 1, further comprising:
a microlens disposed over the first side, wherein outer edges of the microlens correspond to outer edges of the photodetector.

12. An image sensor comprising:
a semiconductor substrate having a first side and a second side, wherein a photodetector is arranged in the semiconductor substrate between the first side and the second side;
a ring structure extending into the second side of the semiconductor substrate and laterally surrounding the photodetector; and
multiple trench structures laterally surrounded by the ring structure and laterally spaced apart from one another within the photodetector, the multiple trench structures extending from the second side of the semiconductor substrate into the photodetector.

13. The image sensor of claim 12, further comprising:
an interconnect structure arranged beneath the first side of the semiconductor substrate such that the first side of the semiconductor substrate is arranged between the interconnect structure and the second side of the semiconductor substrate.

14. The image sensor of claim 12, further comprising:
a microlens disposed over the first side, wherein outer edges of the microlens correspond to outer edges of the photodetector.

15. The image sensor of claim 12, wherein the ring structure has a first depth into the second side and the multiple trench structures have a second depth into the second side, wherein the first depth ranges between 30% and 150% of the second depth.

16. An image sensor comprising:
a semiconductor substrate having a frontside and a backside and including a well region of a first conductivity type and a doped region of a second conductivity type between the frontside and the backside, wherein doped region meets the well region at a junction corresponding to a photodetector;
a ring structure extending into the backside of the semiconductor substrate and laterally surrounding the photodetector; and
a trench structure extending from the backside of the semiconductor substrate into the photodetector such that the doped region extends continuously from a first sidewall of the trench structure, under a bottom of the trench structure, and to a second sidewall of the trench structure opposite the first sidewall within the ring structure.

17. The image sensor of claim 16, wherein the ring structure and the trench structure include a high-K dielectric material.

18. The image sensor of claim 16, wherein the trench structure further includes at least one air gap.

19. The image sensor of claim 16, wherein the ring structure and the trench structure further include a silicon-containing and oxygen-containing dielectric material.

20. The image sensor of claim 16, wherein the trench structure includes one or more first sidewalls and one or more second sidewalls perpendicular to the first sidewalls, wherein the one or more first sidewalls extend in parallel with a first edge of the ring structure and the one or more second sidewalls extend in parallel with a second edge of the ring structure.

* * * * *